(12) United States Patent
Hembree

(10) Patent No.: US 6,211,960 B1
(45) Date of Patent: Apr. 3, 2001

(54) METHOD AND APPARATUS FOR ALIGNING AND CONNECTING SEMICONDUCTOR COMPONENTS TO SUBSTRATES

(75) Inventor: David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/300,362

(22) Filed: Apr. 26, 1999

Related U.S. Application Data

(62) Division of application No. 08/977,312, filed on Nov. 24, 1997, now Pat. No. 6,048,750.

(51) Int. Cl.[7] .................................................. G01N 11/00
(52) U.S. Cl. ............................................ 356/400; 356/401
(58) Field of Search ................................. 356/345, 363, 356/399, 400, 401, 358

(56) References Cited

U.S. PATENT DOCUMENTS

| | | | |
|---|---|---|---|
| 4,585,991 | 4/1986 | Reid et al. | 324/158 P |
| 4,899,921 | 2/1990 | Bendat et al. | 228/105 |
| 5,124,918 | 6/1992 | Beer et al. | 364/424.02 |
| 5,172,050 | 12/1992 | Swapp | 324/158 P |
| 5,329,423 | 7/1994 | Scholz | 361/760 |

(List continued on next page.)

OTHER PUBLICATIONS

Baker, Stuart. "How Machine Design Affects Placement Precision", SMT, Nov. 1997, pp. 50–54.

O'Connor, Roy, "Inverted struts improve hexapod rigidity", Stuttgart, Germany, Hexact, date unknown.

O'Connor, Roy. "Inverted struts improve hexapod rigidity", Engineering News, date unknown, p. 56.

"Sandia Hexapod Project", Sandia National Laboratories, visual media information, Mar. 15, 1996.

"Advanced Machine Tool Structures, The Shape of a New Machine", National Institute of Standards and Technology, visual media information, Jan. 13, 1997.

LME Hexapod Machine, "M–800 Hexapod—6–Degrees–Of–Freedom Micropositioner", visual media information, Jan. 1997.

John Storrs, "Distribution Notes for Hexapod–1.0", Laboratory for Micro Enterprise, pp. 1–3, Sep. 1996.

Stewart Platform Automated Error Analysis, Ingersoll, visual media information, Apr. 25, 1997.

"Hexel Corporation . . . Solutions", advertising brochure, Hexel Corporation, Sep. 1994.

Greg Changler, "Hexapod Six–Axis Machining Center", visual media information, Jan. 1997.

Primary Examiner—Robert Kim
(74) Attorney, Agent, or Firm—Stephen A. Gratton

(57) ABSTRACT

A method and apparatus for aligning and connecting objects, such as semiconductor components and substrates, are provided. The apparatus includes a hexapod with a moving platform for holding an object for movement in six degrees of freedom. The apparatus also includes a chuck assembly for holding a mating object in a stationary position. A camera and a height gauge are mounted on the moving platform to allow determination of the position and orientation of the object on the chuck assembly. Likewise, a camera and a height gauge are mounted on the chuck assembly to allow determination of the position and orientation of the object on the moving platform. The hexapod includes linear actuators operable by a controller upon signal input from the cameras and height gauges. The apparatus can be used to electrically connect semiconductor dice and chip scale packages to interconnects for testing. In addition, the apparatus can be used for bonding dice to substrates and leadframes, for probe testing semiconductor wafers, and for aligning and connecting spaced components, such as a baseplate and display screen of a field emission display.

28 Claims, 5 Drawing Sheets

U.S. PATENT DOCUMENTS

| | | | |
|---|---|---|---|
| 5,483,741 | 1/1996 | Akram et al. | 29/846 |
| 5,500,605 | 3/1996 | Chang | 324/758 |
| 5,519,332 | 5/1996 | Wood et al. | 324/755 |
| 5,539,324 | 7/1996 | Wood et al. . | |
| 5,541,525 | 7/1996 | Wood et al. | 324/755 |
| 5,547,537 | 8/1996 | Reynolds et al. . | |
| 5,604,593 | 2/1997 | McMurtry | 356/358 |
| 5,634,267 | 6/1997 | Farnworth et al. | 29/840 |
| 5,634,585 | 6/1997 | Stansbury | 228/105 |
| 5,686,317 | 11/1997 | Akram et al. | 437/8 |
| 5,739,050 | 4/1998 | Farnworth . | |
| 5,869,974 | 2/1999 | Akram et al. | 324/754 |
| 5,878,485 | 3/1999 | Wood et al. . | |
| 5,894,161 | 4/1999 | Akram et al. . | |
| 5,896,036 | 4/1999 | Wood et al. . | |
| 5,952,840 | 9/1999 | Farnworth et al. . | |
| 5,962,921 | 10/1999 | Farnworth et al. . | |
| 6,016,060 | 1/2000 | Akram et al. . | |
| 6,048,750 | 4/2000 | Hembree . | |

METHOD AND APPARATUS FOR ALIGNING AND CONNECTING SEMICONDUCTOR COMPONENTS TO SUBSTRATES

CROSS REFERENCE TO RELATED APPLICATIONS

This application is a division of patent application Ser. No. 08/977,312 filed Nov. 24, 1997, U.S. Pat. No. 6,048,750.

FIELD OF THE INVENTION

This invention relates to semiconductor manufacture, and more particularly to a method and apparatus for aligning and bonding semiconductor components, such as bare dice and chip scale packages, to a substrate, such as an interconnect, or a printed circuit board.

BACKGROUND OF THE INVENTION

Semiconductor components are used in the fabrication of electronic items, such as multi chip modules. For example, bare semiconductor dice can be mounted to substrates such as printed circuit boards, and ceramic interposers. Flip chip mounting of bumped dice is one method for electrically connecting the dice to the substrates. With flip chip mounting, solder bumps on the device bond pads are reflowed into electrical contact with contacts on the substrate. Chip on board (COB) mounting of dice to substrates can also be employed. With chip on board mounting, wire bonds are formed between the device bond pads and contacts on the substrate.

Chip scale packages are sometimes used in place of bare dice for fabricating electronic items. Typically, a chip scale package includes a substrate bonded to the face of a bare die. The substrate includes the external contacts for making outside electrical connections to the chip scale package. The external contacts for one type of chip scale package include solder balls arranged in a dense array, such as a ball grid array (BGA), or a fine ball grid array (FBGA). In general, chip scale packages can be mounted to substrates using the same mounting methods employed with bare dice (e.g., flip chip, COB).

Besides making permanent electrical connections between semiconductor components and substrates for fabricating multi chip modules or other packaging applications, electrical connections are sometimes necessary for testing applications. For example, bare dice are tested in the manufacture of known good die (KGD). Chip scale packages must also be tested prior to use in electronic items. In these cases the electrical connections with the device bond pads for bare dice, or with the external contacts for chip scale packages, are preferably non-bonded, temporary electrical connections.

In either packaging or testing applications, the substrate includes contacts that must be physically aligned with, and then electrically connected to corresponding contacts on the component. As semiconductor components become smaller, and the contacts become denser, aligning and electrically connecting the components to substrates become more difficult. Accordingly, a key design consideration in the packaging and testing of semiconductor components, is the method for aligning and connecting the components to the mating substrates.

An example of a test assembly for semiconductor components is shown in FIG. 1. The test assembly includes a carrier 2 adapted to temporarily package a semiconductor component 9 for testing. The component 9 includes contacts 11 in electrical communication with integrated circuits on the component 9. Mounted within the carrier 2 is an interconnect 4. The interconnect can be attached to the carrier 2 using an adhesive layer 6. Included on the interconnect 4 are patterns of contacts 8 configured to make separate electrical connections with the contacts 11 on the component 9. Exemplary carriers and interconnects are more fully described in U.S. Pat. Nos. 5,519,332 and 5,541,525 to Wood et al.

In the test assembly of FIG. 1, the interconnect 4 is the substrate to which the component 9 must be aligned and connected. An assembly device can be used for aligning and connecting the component 9 to the interconnect 4. This type of assembly device is described in the above cited patents, and also in U.S. Pat. No. 5,634,267 to Wood et al. In general the assembly device aligns the component and the interconnect, and then brings the component and interconnect together to place the contacts on the component in electrical communication with the contacts on the interconnect.

To facilitate the aligning and connecting process, the tips of the contacts 8 on the interconnect 4 are preferably in the same plane, and the surfaces of the contacts 11 on the component 9 are preferably in the same plane. However, this may not always be the case. Also, the contacts 8 on the interconnect 4 are preferably parallel to either the top or the bottom surfaces of the carrier 2, because these surfaces can be used to mount the carrier 2 to the assembly device. However, in actual practice, the plane containing the contacts 8 is rarely parallel to either the top or the bottom surface of carrier 2. This makes the alignment and connecting process more difficult because these differences in planarity can cause misalignment between the contacts 8 on the interconnect 4 and the contacts 11 on the component 9.

Referring to FIG. 2, another interconnect 4A is shown attached to another carrier 2A using an adhesive layer 6A. Contacts 8A on the interconnect 4A are designed to be electrically connected to the contacts 11 on the component 9 which is being held by a vacuum quill 7 of the assembly device. Plane A is the plane containing the bottom surface of the carrier 2A. Plane B is the plane containing the bottom surface of interconnect 4A. Plane C is the plane containing the top surface of the interconnect 4A. Plane D is the plane containing the contacts 8A. Plane E is the plane containing the surface of component 9 and the contacts 11.

Due to the fabrication process that is used to manufacture interconnects, planes B, C and D can be made substantially planar. However, due to variations in the thickness of the adhesive layer 6A, planes B, C and D are rarely parallel to plane A. Accordingly, even if plane E can be properly oriented with respect to plane A, plane E is not necessarily parallel to or appropriately aligned with plane D or contacts 8A.

One aspect of prior art assembly devices is that most devices are typically able to align the component and interconnect in only four degrees of freedom (X, Y, Z, Θ). Alignment of the component and interconnect in the other two degrees of freedom (Φ, Ψ) is usually not performed. Accordingly, when the component and interconnect are moved together in the Z-axis direction, the contacts on the component may not always engage the contacts on the interconnect along the same plane. This misalignment can cause pivoting of the component, or interconnect, and further misalignment. Also, the potential of misalignment can require overdriving the component, or the interconnect, in the Z-axis direction to make reliable electrically connections. This overdrive can damage the contacts on the components and substrate.

The same alignment problems as outlined above may also be present in flip chip mounting of components to circuit boards. In this case assembly devices such as aligner bonder tools can be used to align and then bond semiconductor dice to a substrate. A representative aligner bonder tool is disclosed in U.S. Pat. No. 4,899,921 to Bendat et al. These types of tools typically require two separate platforms whose movement must be coordinated. In addition, split vision optics with movable optical probes can be required to view aligned portions of the dice and substrate. The different types of mechanisms required for alignment and optics makes aligner bonder tools relatively complicated and difficult to operate with high precision.

Another example of a semiconductor process involving alignment occurs during wafer probe testing. During probe testing a probe card must be aligned and placed in electrical contact with the wafer. With one type of probe card, needle probes make the electrical connections with contacts on the wafer. Routine maintenance of these probe cards includes checking the position of the needle probes in relation to the contacts on the wafer. However, even with periodic maintenance, the tips of the needle probes can be misaligned in the X, Y and Z-directions. Consequently, some of the needle probes may be misaligned with the contacts on the wafer. The same situation can occur due to differences in the X, Y and Z-direction locations of the contacts on the wafer. If the needle probes cannot flex enough to compensate for misalignment, then the resultant electrical connections can be poor.

Besides the above examples, alignment problems can occur in other semiconductor packaging or assembly processes such as wire bonding and adhesive bonding of dice to leadframes. Another manufacturing process involving alignment occurs during fabrication of flat panel field emission displays (FEDs). An individual field emission display pixel includes emitter sites formed on a baseplate. Electrons emitted by the emitter sites strike phosphors contained on a display screen to form an image. During fabrication of the field emission display it is necessary to align the baseplate with the display screen. However, field emission displays are typically constructed as a sealed package with a vacuum space between the baseplate and the display screen. This spaces complicates the alignment procedure because most alignment devices, such as aligner bonder tools, are constructed to bring the mating components into physical contact.

Due to the foregoing, it would be desirable for an assembly device for semiconductor components to be capable of alignment in six degrees of freedom including three translational degrees of freedom (X, Y, Z) and three rotational degrees of freedom (Θ, Φ, Ψ). The present invention is directed to an automated assembly device capable of alignment in six degrees of freedom. The assembly device can align semiconductor components, or substrates, in three translational and three rotational degrees of freedom, while maintaining a high degree of accuracy and speed.

SUMMARY OF THE INVENTION

In accordance with the present invention, a method and apparatus for aligning and connecting a semiconductor component and a substrate are provided. The apparatus includes a platform assembly and a chuck assembly. The platform assembly is configured to move one object, either the component or substrate, in six degrees of freedom (X, Y, Z, Θ, Φ, Ψ), as the other object is held stationary by the chuck assembly. This enables alignment and physical contact to be achieved with a high degree of precision.

In an illustrative embodiment the platform assembly comprises a hexapod, and includes a fixed platform and a moving platform. The moving platform is coupled to the fixed platform by six linear actuators. The moving platform includes a holding mechanism for holding the moving object, either the component or the substrate, for movement therewith. The linear actuators require minimal movement and control to effect movement of the moving platform and moving object in six degrees of freedom.

The alignment of the component with the substrate is accomplished through the use of cameras and height gauges mounted on the moving platform and the chuck assembly. The cameras are capable of obtaining images of the facing surfaces of the component and substrate. The height gauges are capable of determining the distances between the gauges and facing surfaces of the component and substrate.

The cameras convert the images into electronic signals which are transmitted to a controller, such as a computer or CPU. Likewise, the height gauges transmit electronic signals of the distance data to the controller as well. The controller utilizes the image information, and the distance information, to determine the relative rotational axis orientation (Θ, Φ, Ψ), of the facing surface of the component, relative to the rotational axis orientation (Θ, Φ, Ψ) of the facing surface of the substrate. The controller can also utilize the information to identify the X, Y and Z coordinates of the contacts on the component and substrate. Upon determining the X, Y and Z coordinates of the contacts, and the relative rotational axis orientation of the planes of the contacts, the controller operates the linear actuators of the platform assembly to move the moving object into alignment and physical contact with the stationary object.

The method of the present invention, generally stated, includes the steps of: providing a platform assembly capable of moving a semiconductor component, or a substrate, in three degrees of translational freedom and three degrees of rotational freedom, the platform assembly comprising a hexapod; providing a chuck assembly for holding the component, or the substrate, proximate to the platform assembly; determining the position and orientation of contacts on the component and contacts on the substrate; moving the platform assembly responsive to the determining step until the contacts on the component and substrate are spatially aligned and parallel; and operating the platform assembly responsive to the determining step to move the component into contact with the substrate.

DETAILED DESCRIPTION OF THE PREFERRED EMBODIMENTS

Figure 1:
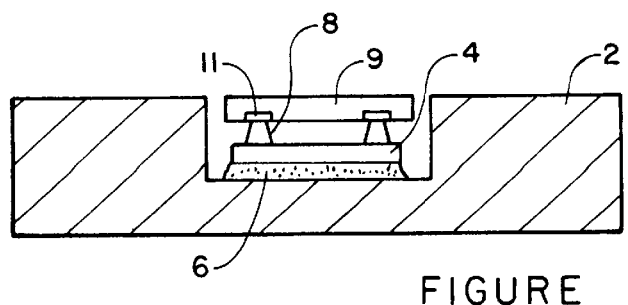
FIG. 1 is a cross-sectional view of a prior art carrier containing a semiconductor component and an interconnect.
Figure 2:
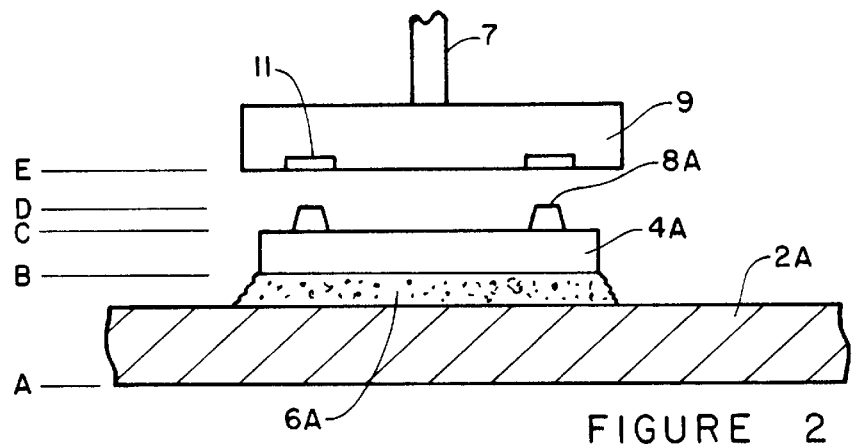
FIG. 2 is a cross-sectional view of a prior art test carrier and a semiconductor component being aligned and connected to an interconnect of the carrier using an assembly device.
Figure 3:
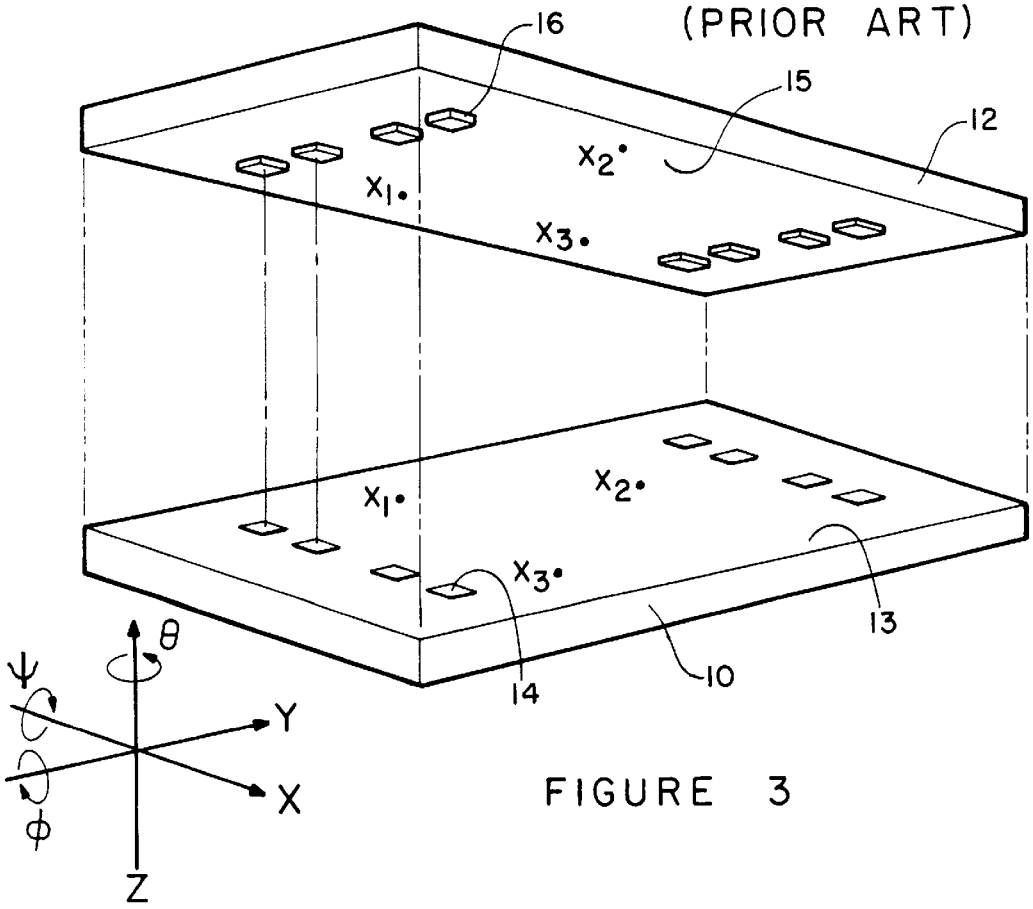
FIG. 3 is an exploded view of a component and a substrate during an aligning and connecting process performed in accordance with the invention.

Referring to FIG. 3, a semiconductor component 10 and a substrate 12 are illustrated prior to being aligned and electrically connected to one another. The component 10 includes a facing surface 13 with a plurality of component contacts 14 formed thereon. The substrate 12 includes a facing surface 15 with a plurality of substrate contacts 16 formed thereon.

Figures 3A, 3B, 3C:
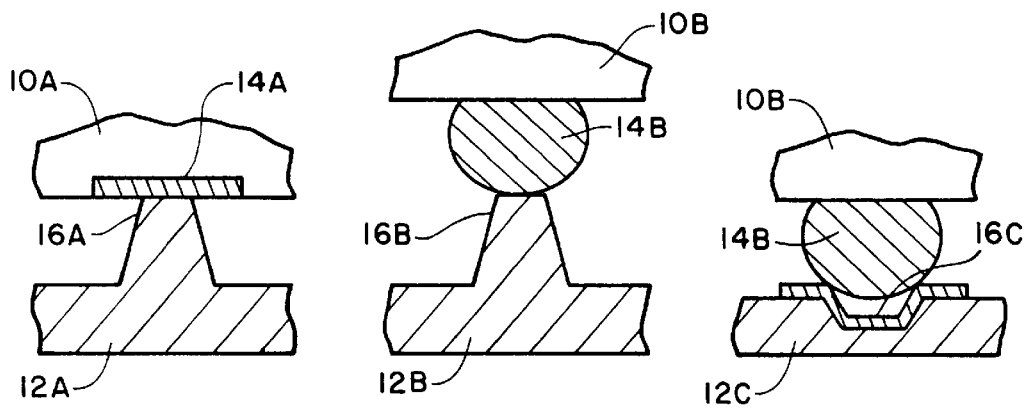
FIG. 3A is an enlarged schematic cross sectional view of a planar contact on a semiconductor component electrically connected to a contact on a substrate.
FIG. 3B is an enlarged schematic cross sectional view of a bumped contact on a semiconductor component electrically connected to a contact on a substrate.
FIG. 3C is an enlarged schematic cross sectional view of the bumped contact on a semiconductor component electrically connected to a contact on a substrate.

FIGS. 3A–3B illustrate exemplary components 10 and substrates 12. In FIG. 3A, the component comprises a semiconductor die 10A and the component contacts comprise bond pads 14A on the face (circuit side) of the die 10A. The substrate comprises an interconnect 12A and the substrate contacts comprise contact members 16A. The contact members 16A are adapted to establish temporary electrical connections with the bond pads 14A for testing. Interconnect 12A is more fully described in U.S. Pat. No. 5,483,741 to Akram et al., incorporated herein by reference.

In FIG. 3B, the component comprises a chip scale package 10B, and the component contacts comprise solder bumps 14B formed on a BGA substrate of the package 10B. The substrate comprises an interconnect 12B and the substrate contacts comprise contact members 16B adapted to establish temporary electrical connections with the solder bumps. Interconnect 12B is more fully described in U.S. patent application Ser. No. 08/823,490, now U.S. Pat. No. 6,016,060, entitled "Method, Apparatus And System For Testing Bumped Semiconductor Components", incorporated herein by reference.

In FIG. 3C, the component again comprises the chip scale repackage 10B and the component contacts comprise the solder bumps 14B. The substrate comprises an interconnect 12C and the substrate contacts comprise indentation contact members 16C adapted to retain and electrically contact the solder bumps 14B. Interconnect 12C is more fully described in U.S. patent application Ser. No. 08/829,193, now U.S. Pat. No. 5,962,921, entitled "Interconnect Having Recessed Contact Members With Penetrating Blades For Testing Semiconductor Dice And Packages With Contact Bumps", incorporated herein by reference.

Referring again to FIG. 3, during a test procedure the component 10 and the substrate 12 must be aligned and electrically connected to one another. In the assembled configuration, the substrate contacts 16 form separate electrical connections with the component contacts 14 for testing. This can be accomplished by holding either the component 10 or the substrate 12 stationary, and moving the other object in a direction that includes X and Y translational components, and $\Theta$, $\Phi$ and $\Psi$ rotational components to achieve spatial alignment and parallelism. In addition to being moved with two translational components and three rotational components, the moving object is moved with a Z-direction component, to achieve physical contact between the substrate contacts 16 and the component contacts 14.

Figure 4:
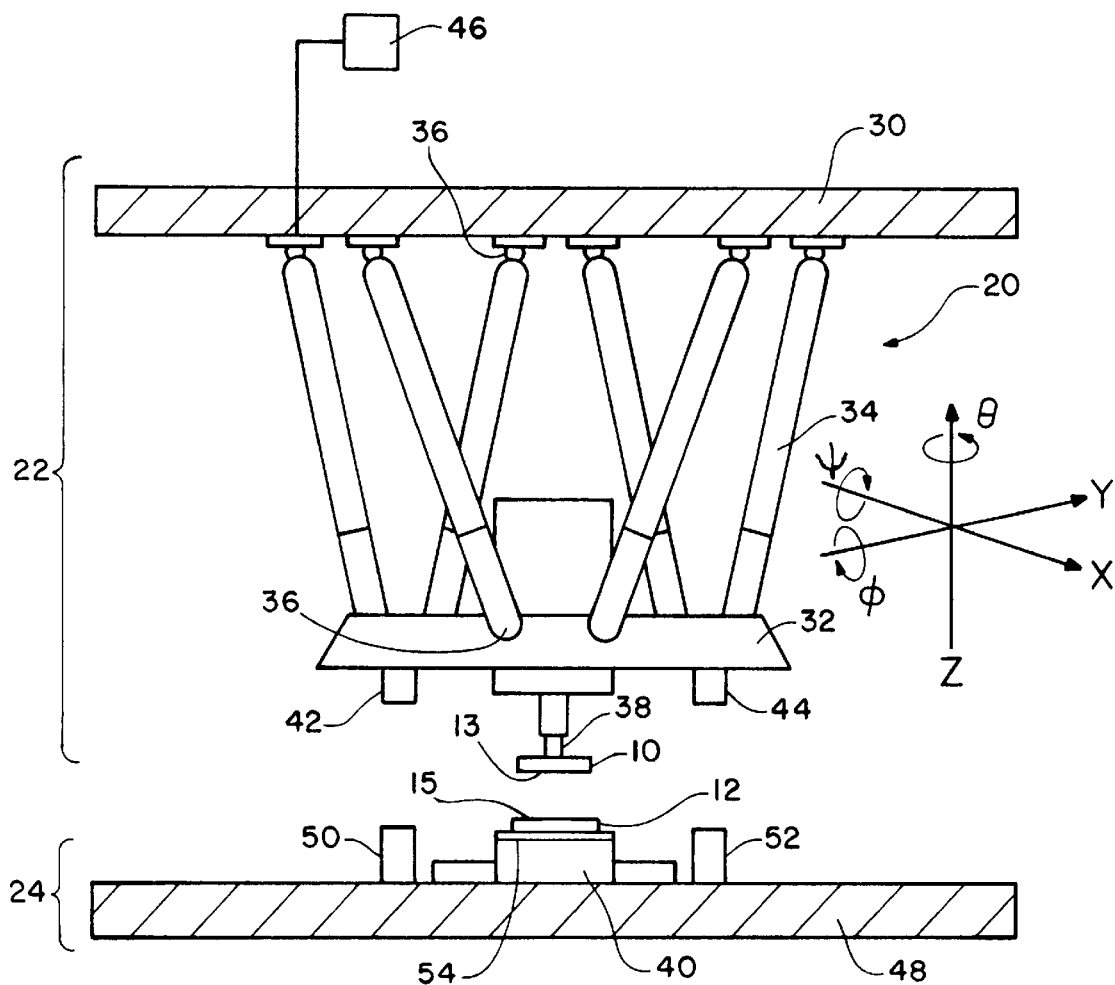
FIG. 4 is a schematic cross-sectional view of an apparatus constructed in accordance with the invention.

Referring to FIG. 4, an apparatus 20 for aligning and connecting the component 10 and the substrate 12 is illustrated. The apparatus 20 comprises two primary components, a platform assembly 22 and a chuck assembly 24. The chuck assembly 24 holds one object, for example, the substrate 12, in a fixed position and orientation. The platform assembly 22 holds a second object, for example, the component 10.

The platform assembly 22 is able to move the component 10 in six degrees of freedom, namely three translational degrees of freedom (X, Y, Z) and three rotational degrees of freedom ($\Theta$, $\Phi$, $\Psi$). The degrees of freedom can be according to conventional definitions wherein the X-axis and Y-axis are orthogonal and co-planar, and the Z-axis is contained in a plane orthogonal to the plane of the X-axis and Y-axis. As is also conventional, $\Theta$ can be angular rotation about the Z-axis, $\Phi$ can be angular rotation about the Y-axis, and $\Psi$ can be angular rotation about the X-axis. The three rotational degrees of freedom are also sometimes referred to as pitch, yaw and roll.

In order to allow movement, in six degrees of freedom, with high precision, the platform assembly 22 comprises a hexapod, or Stewart platform. The platform assembly 22 includes a fixed platform 30 and a moving platform 32. The moving platform 32 is connected to the fixed platform 30 by a plurality of linear actuators 34. The linear actuators 34 are preferably connected to the fixed platform 30 and to the moving platform 32 by universal ball joints 36 at each end thereof. While universal ball joints 36 are preferred, other connection mechanisms allowing sufficient freedom of movement could be utilized without departing from the spirit and scope of the present invention. In addition, the linear actuators 34 are preferably controlled by a controller 46 such as a computer controller, or a central processing unit (CPU). In general the controller 46 must possess sufficient computing power to precisely control the six linear actuators 34.

The platform assembly 22 also includes a holding mechanism 38 attached to the moving platform 32 for holding the component 10. The holding mechanism 38 is configured to hold the component 10 in a fixed relationship relative to the moving platform 32, such that the component 32 moves with the moving platform 32. One type of holding mechanism 38 suitable for this application is a vacuum quill. Vacuum quills are known in the art and utilized in handling semiconductor components in a variety of systems (e.g., semiconductor pick and place mechanisms).

The chuck assembly 24 is stationary and holds the substrate 12 in a fixed position and orientation. In particular, the chuck assembly 24 includes a chuck 40 that fixedly retains the substrate 26 during the aligning and connecting process, and then subsequently allows release. While in the apparatus 20 of FIG. 4, the component 10 is mounted for movement by the platform assembly 22, and the substrate 12 is held stationary by the chuck assembly 24 this could be reversed. Specifically, the component 10 could be held by the chuck assembly 24 and the substrate 12 moved by the platform assembly 22.

Still referring to FIG. 4, the position and orientation of substrate 12 is accomplished through the use of a height gauge 42 and a camera 44 mounted on the moving platform 32. While a laser height gauge is preferred, other distance measuring devices such as an interferometer can also be employed. The height gauge 42 and camera 44 are configured for attachment to the moving platform 32, and are sized to allow clearance from the items mounted on chuck assembly 24 during the aligning and connecting process. As those skilled in the art will appreciate the height gauge 42 and camera 44 could also be mounted independently of the moving platform 32. In this case the height gauge 42 and camera can be mounted for movement on an X, Y and Z translational stage. In addition, if the degree of movement required for a particular process is larger than the linear actuators 34 can accomplish, then an X, Y, Z translational stage can be used to accomplish large movement, while the moving platform 32 is used to accomplish alignment and fine movement. Also dual moving platforms 32 can be employed or one moving platform can be mounted on another moving platform.

The height gauge 42 and camera 44 are in signal communication with the controller 46 which operates the linear actuators 34. The height gauge 42 and camera 44 generate electronic signals which are transmitted to the controller 46. The controller 46 is configured to receive and analyze the signals and to operate the linear actuators 36 in response to the signals.

During an aligning and connecting process, the moving platform 32 can be moved such that the height gauge 42 is proximate to the substrate 12, and is able to determine the distance between the height gauge 42 and the substrate 12. This distance information can be converted into a signal, which can be optically or electrically transmitted to the controller 46. The distance information gives a Z-axis coordinate for the substrate 12.

Similarly, the moving platform 32 can be moved such that the camera 44 is proximate to the substrate 12 and can generate an image of the facing surface 15 of the substrate 12. The visual image can be used to identify three reference points X1, X2, X3 (FIG. 3) on the facing surface 15. The references points X1, X2, X3 can be known features of the substrate 12, such as the substrate contacts 16, or can be dedicated alignment fiducials formed on the substrate 12. This image is then converted into a signal which can be optically or electrically transmitted to the controller 46. By noting the X-axis and Y-axis coordinates of the reference points X1, X2, X3, and the Z-axis coordinate obtained by the height gauge 42, the position and orientation of the plane containing the reference points can be determined. This calculation can be performed by the controller 46 or can be performed by another computer (not shown) in signal communication with the controller 46.

The position and orientation of the component 10 can be determined in a similar manner. Specifically, a camera 50 and a height gauge 52 are mounted on a base 48 of the chuck assembly 24. Operation of the platform assembly 22 allows the component 10 to be placed proximate to the height gauge 52 to determine distance information and the Z-axis coordinate of the component 10. Similarly, the component 10 can be placed proximate to the camera 50, and a visual image can then be obtained and communicated to the controller 46. The visual image can be used to identify the X-axis and Y-axis coordinates of at least three points Y1, Y2, Y3 (FIG. 3) on the facing surface 13 of the component 10. Again the three points can be features such as the component contacts 14 or can be dedicated alignment fiducials. Using this information and the Z-axis coordinate from the height gauge 52, the orientation and position of the component 10 can be calculated by the controller 46 or another computer in signal communication with the controller.

Once the position and orientation of the facing surface 15 of the substrate 12 and the facing surface 13 of the component 10 are determined, the positions of the substrate contacts 16 (FIG. 3) and the component contacts 14 (FIG. 3) can likewise be determined. Using this information, the controller 46 can operate the linear actuators 34 to align the component contacts 14 with the substrate contacts 16 in the X-axis direction and Y-axis direction. Similarly, the orientation of the component 10 can be adjusted so that the facing surface 13 of the component 10 is parallel to the facing surface 15 of the substrate 12. With this movement, the substrate 12 and the component 10 are aligned in five degrees of freedom (i.e., X, Y and three rotational degrees). In addition, the controller 46 can operate the linear actuators 34 to move the moving platform 32 and the component 10 with a Z-axis component, while maintaining the parallelism and X-Y alignment, until contact is achieved. Alignment and contact in six degrees of freedom can be a continuous process or can be performed in stages.

The amount of Z-axis direction movement can be selected to place the component contacts 14 (FIG. 3) and the substrate contacts 16 (FIG. 3) in physical and electrical contact. However, some amount of Z-direction overdrive may be required to accommodate differences in the Z-direction location (e.g., height) of the component contacts 14 or the substrate contacts 16. If desired, a compliant member 54 can be mounted on the chuck 40 subjacent to the substrate 12 as a cushion for Z-direction overdrive. For example, the compliant member 54 can comprise an elastomeric material such as silicone, or alternately a gas or liquid filled bladder.

Figure 5:
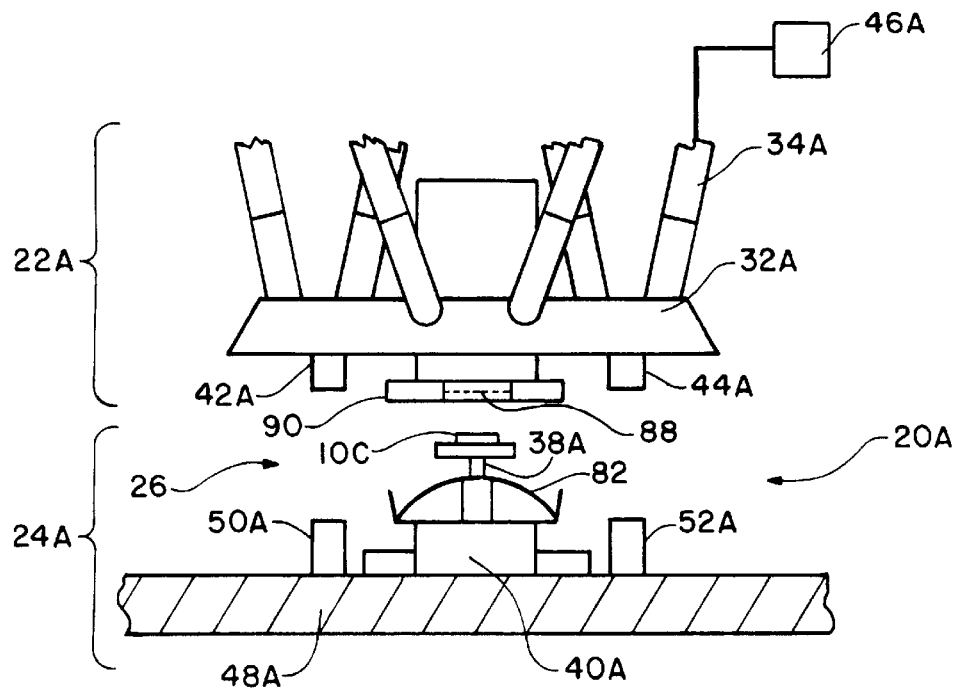
FIG. 5 is a schematic cross-sectional view of an alternate embodiment apparatus constructed in accordance with the invention for assembling a test carrier.

Referring to FIG. 5, an alternate embodiment apparatus 20A is shown. The apparatus 20A is configured to assemble a carrier 26 for testing a semiconductor component 10C. The carrier 26 can be constructed as described in previously cited U.S. Pat. Nos. 5,519,332 and 5,541,525 to Wood et al.

The apparatus 20A includes a platform assembly 22A and a chuck assembly 24A, constructed substantially as previously described. A force distribution mechanism 82 of the carrier 26 is mounted to a chuck 40A of the chuck assembly 24A. In addition, a holding mechanism 38A is associated with the chuck assembly 24A for holding the component 10C.

An interconnect 88 is mounted to a base 90 of the carrier 26. The base 90 is mounted to a moving platform 32A of the platform assembly 22A. Linear actuators 34A are connected to the moving platform 32A to allow the position of the moving platform 32A and thus the base 32A to be adjusted in six degrees of freedom. The linear actuators 34A are controlled by a controller 46A, substantially as previously described. The platform assembly 22A also includes a height gauge 42A and a camera 44A configured to determine the orientation of component 10C. In addition, a camera 50A and a height gauge 52A are mounted on a base 48A of the chuck assembly 24A to determine the position and orientation of the interconnect 88.

The platform assembly 22A can be operated as previously described to align the interconnect 88 with the component 10C, and to move the interconnect 88 with a Z-direction component into contact with the component 10C. At the same time, the force distribution mechanism 82 contacts and latches onto the carrier base 90, to bias the component 10C against the interconnect 88. As thus assembled, the carrier 26 can be removed from the apparatus 20A and used to test the component 10C.

Figure 6:
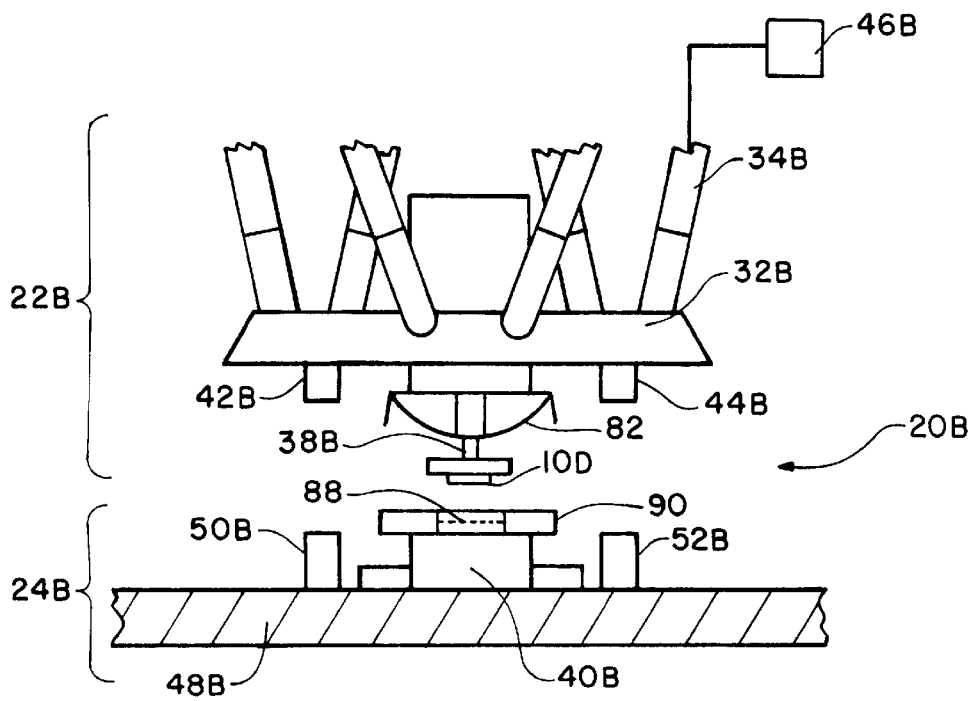
FIG. 6 is schematic cross-sectional view of an alternate embodiment apparatus constructed in accordance with the invention for assembling a test carrier.

Referring to FIG. 6, an alternate embodiment apparatus 20B is shown. The apparatus 20B is configured to assemble the carrier 26 previously described for testing the semiconductor component 10C. The apparatus 20B is constructed as previously described for apparatus 20A, but the component 10C, and force distribution mechanism 82, are mounted to a holding mechanism 38B on the moving platform 32B. The carrier base 90 and interconnect 88 are mounted to a chuck 40B of a chuck assembly 24B. As before, a height gauge 42B and a camera 44B on a moving platform 32B, determine the position and orientation of the interconnect 88. Height gauge 50B and camera 52B on a base 48B of the chuck assembly determine the position and orientation of the component 10C. This information can be transmitted to a controller 46B for operating linear actuators 34B to move a moving platform 32B as previously described and assemble the carrier 26.

Figure 7:
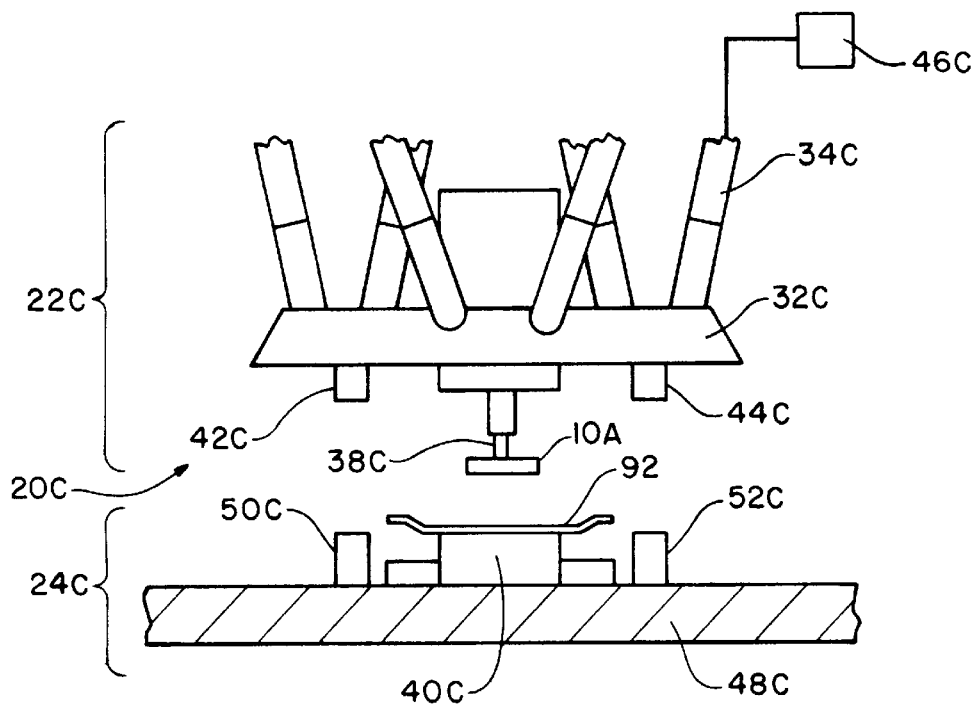
FIG. 7 is a schematic cross-sectional view of an alternate embodiment apparatus constructed in accordance with the invention for attaching a die to a leadframe.

Referring to FIG. 7, an alternate embodiment apparatus 20C for aligning and connecting the semiconductor die 10A to a lead frame 92 is shown. In this embodiment the apparatus 20C functions in the same manner as a die attacher. For example, the lead frame 92 can include a mounting paddles and the die 10A can be adhesively bonded to the lead frame 92. As another example, the die 10A and leadframe 92 can be in a lead on chip (LOC) configuration wherein lead fingers on the leadframe 92 are adhesively bonded to a face of the die 10A.

The apparatus 20C includes a platform assembly 22C and a chuck assembly 24C, constructed substantially as previously described. The die 10A is held by a holding mechanism 38C which is connected to a moving platform 32C of the platform assembly 22C. The moving platform 32C is connected via a plurality of linear actuators 34C to a fixed platform (not shown). As before the linear actuators 34C are controlled by a controller 46C. Also connected to the moving platform 32C are a height gauge 42C and a camera 44C. The lead frame 92 is held in place by a chuck 40C which is attached to a base 48C of the chuck assembly 24C. Also mounted on the base 48C are a camera 50C and a height gauge 52C.

Figure 8:
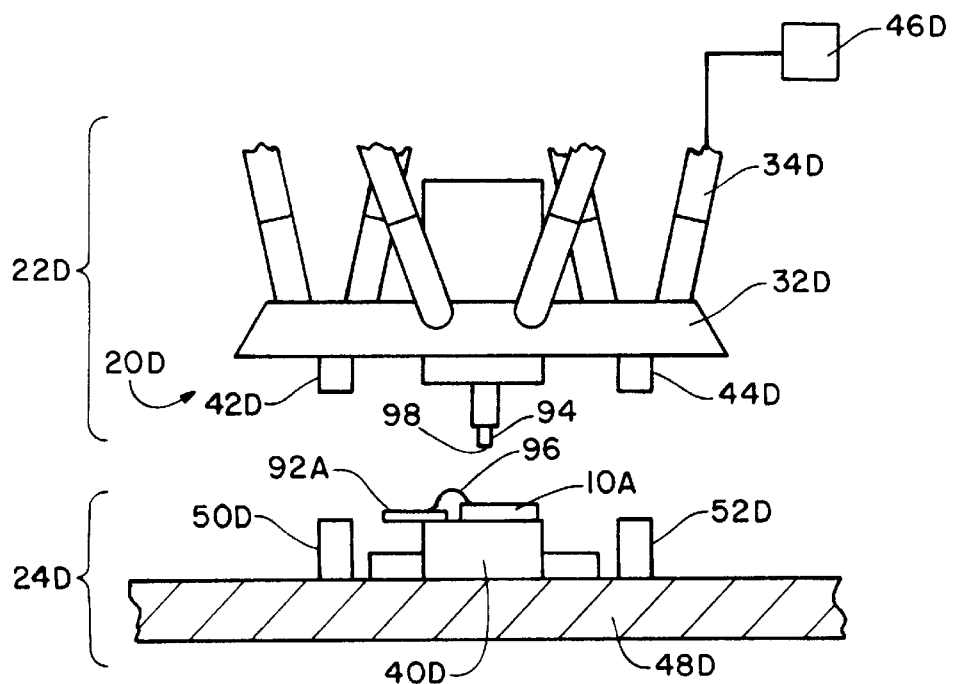
FIG. 8 is a schematic cross-sectional view of an alternate embodiment apparatus constructed in accordance with the invention for wire bonding a die to a leadframe.

As previously explained, the linear actuators 34C can be moved to locate the moving platform 32C and the die 10A proximate to the camera 50C and the height gauge 52C to allow the controller 46C to determine the orientation and position of the die 10A. Likewise, camera 44C and height gauge 42C can be used to determine the position and orientation of a bond site on the lead frame 92. Using this information the die 10A can be bonded to the bond site on the leadframe 92. In this case the connection is adhesive rather than electrical. For making the adhesive connection an adhesive can be applied to the die 10A or to the leadframe 92 prior to contact therebetween Referring to FIG. 8 an apparatus 20D for wire bonding, or tape automated bonding (TAB), the die 10A to a leadframe 92A is illustrated. The apparatus 20D includes a platform assembly 22D and a chuck assembly 24D, constructed substantially as previously described. A moving platform 32D is connected by plurality of linear actuators 34D to a fixed platform (not shown). The linear actuators 34D are controlled by a controller 46D. Attached to the moving platform 32D is a bonding tool 94. The bonding tool 94 can be a constructed in the manner of a conventional bonding tool on a conventional wire bonder, or a conventional TAB bonder. For example, the bonding tool 94 can be configured to thermosonically bond, thermocompression bond, TAB bond, or wedge bond, a bonding member 98, such as a wire or TAB tape, held by the tool 94.

A height gauge 42D and a camera 44D are mounted to a moving platform 32D of the platform assembly. The height gauge 42D and camera 44D can be used to ascertain the location and orientation of bonding sites on the die 10A and leadframe 92A. As before the die 10A and leadframe 92A are mounted to a chuck 40D of the chuck assembly 40D. In a similar manner a height gauge 52D and a camera 50D mounted to base 48D of the chuck assembly 40D can be used to ascertain the location and orientation of the bonding tool 94 and wire 98. Using this information the controller 46D can operate the linear actuators 34D to move the bonding tool 94 to form bonded connections 96 between the leadframe 92A and die 10A.

As those skilled in the art will appreciate, the longevity of the bonding tool 94 can be lengthened by proper orientation of the bonding tool 94 relative to the surface to which the bonding member 98 will be bonded. In fact, the bonding tool 94 should ideally always be oriented perpendicular to the bonding sites to which the bonding wire 98 is to be attached. This can easily be accomplished using the apparatus 20D of the present invention. Orientation and position of the bonding sites of the die 10A and leadframe 92A can be identified using the height gauge 42D and the camera 44D as was discussed above. Likewise, the orientation and position of the bonding tool 94 can be determined using camera 50D and height gauge 52D. With this information, and the identification of the bonding sites, the controller 46D can operate the linear actuators 34D to position the bonding tool 94 at the bonding sites to which the bonding member 98 is to be bonded.

The apparatus 20D can also be used to perform processes that are difficult or not possible with a conventional wire bonder. For example, wire bonders can typically only bond on surfaces which are located on parallel planes (i.e., plane of die must be parallel to place of leadframe). However with six degrees of freedom it is possible to bond to planes that are angled with respect to one another. The apparatus 20D can thus be used to wire bond to various electrical devices such as field emission displays and multi chip module substrates containing electrical components on different planes.

Figure 9:
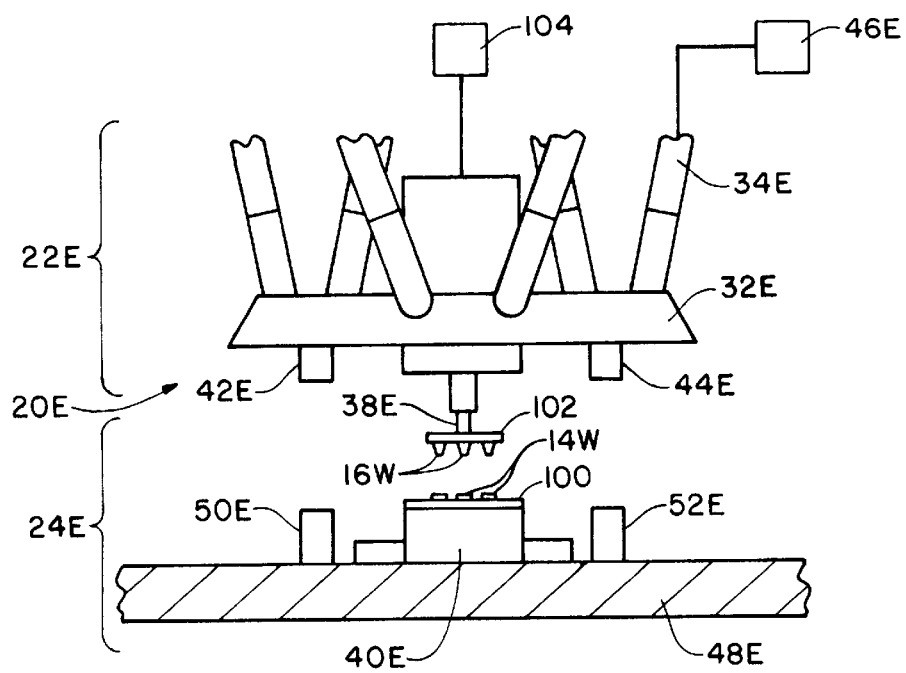
FIG. 9 is a schematic cross-sectional view of an alternate embodiment apparatus constructed in accordance with the invention for probe testing semiconductor wafers.

Referring to FIG. 9, an apparatus 20E for probe testing a semiconductor wafer 100 is illustrated. The apparatus 20E includes a platform assembly 22E and a chuck assembly 24E, constructed substantially as previously described. A moving platform 32E is connected by plurality of linear actuators 34E to a fixed platform (not shown). The linear actuators 34E are controlled by a controller 46E. Attached to the moving platform 32E is a probe card 102 that includes patterns of contact members 16W. The contact members 16W are configured to make temporary electrical connections with corresponding contacts 14W on the wafer 100. In addition, the contact members 16W are in electrical communication with test circuitry 104. The test circuitry 104 generates test signals for testing the integrated circuits contained on the wafer 104 and analyzes the resultant signals from the wafer.

The probe card 102 is substantially equivalent to the interconnect 12A previously described. In addition, the contact members 16W on the probe card 102 can be constructed substantially the same as the contact members 16A–16C (FIGS. 3A–3C) previously described. The probe card 102 can include enough contact members 16W to test one die or groups of dice on the wafer 100. Alternately, the probe card 102 can include enough contact members 16W to test all of the dice contained on the wafer 100 at the same time. U.S. patent application Ser. No. 08/797,719, entitled "Probe Card For Semiconductor Wafers And Method and System For Testing Wafers", which is incorporated herein by reference, describes a method for forming the probe card 102.

A height gauge 42E and a camera 44E are mounted to a moving platform 32E of the platform assembly. The height gauge 42E and camera 44E can be used to ascertain the location and orientation of the contacts 14W on the wafer 100. As before the wafer 100 is mounted to a chuck 40E of the chuck assembly 40E. In a similar manner a height gauge 52E and a camera 50E mounted to base 48E of the chuck assembly 40E can be used to ascertain the location and orientation of the probe card contacts 16W. Using this information the controller 46E can operate the linear actuators 34E to align and move the probe card 102 into electrical engagement with the wafer 100. As is apparent the mounting could be reversed with the probe card 102 held in a stationary position on the chuck 40E and the wafer moved with the moving platform 32E.

In addition to the high alignment accuracy provided by the probe card apparatus 22E, high contact forces can be generated by the moving platform 32E. This would permit a single touch down to electrically engage every wafer contact 14W at the same time. Still further, the probe card apparatus 22E can be used with a conventional needle probe card.

Figure 10:
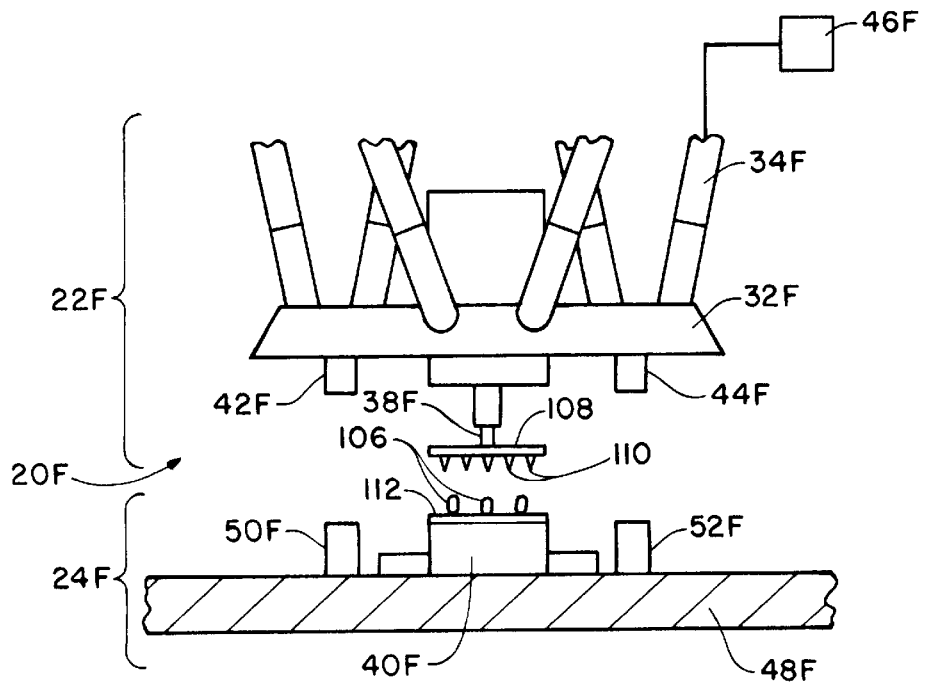
FIG. 10 is a schematic cross-sectional view of an alternate embodiment apparatus constructed in accordance with the invention for assembling a field emission display (FED).

Referring to FIG. 10, an apparatus 20F for assembling an FED baseplate 108 and faceplate 112 is shown. The baseplate 108 includes field emitter sites 110. The faceplate 112 includes components of a display screen that must be aligned with the emitter sites. U.S. Pat. No. 5,634,585 entitled, "Method For Aligning And Assembling Spaced Components", which is incorporated herein by reference, describes FED components in greater detail.

The apparatus 20F includes a platform assembly 22F with a moving platform 32F, linear actuators 34F, height gauge 42F, camera 44F, and a holding mechanism 38F for the baseplate 108. The apparatus 20F also includes a chuck assembly 24F with a base 48F, a chuck 40F for holding the faceplate 112, a camera 50F and a height gauge 52F. All of these components operate similarly to the equivalent components previously described. Using the apparatus 20F the base plate 108 can be aligned with and connected to the faceplate 112 with a required spacing therebetween. Spacers 108 as described in the above patent can be used to maintain the spacing between the base plate 108 and faceplate 112.

METHOD

As can be seen from the foregoing, the method of the present invention can be utilized in the packaging and testing of semiconductor components and in the fabrication of electronic components such as FEDs. The method, generally stated, includes the steps of:

1. Providing a platform assembly for holding a first object. The platform assembly including a fixed platform and a moving platform. The moving platform being connected to the fixed platform by a plurality of linear actuators. The linear actuators operable to move the moving platform in three degrees of translational freedom and three degrees of rotational freedom.

2. Providing a chuck assembly for holding a second object in a stationary position.

3. Determining the position and orientation of the stationary second object. This can be accomplished by operating the linear actuators to move the moving platform, and thus a camera mounted on the moving platform proximate to the second object. The camera obtains an image of the surface of the second object, and more specifically at least three points on the surface, and is able to convert the image into a signal which is transmitted either optically or electrically to a controller. The linear actuators are then operated again to move the height gauge mounted on the moving platform to determine the distance from the height gauge to the three or more points identified on the surface of the first object. The distance information to the at least three points are converted into signals which are transmitted electrically or optically to the controller. Knowing the X and Y coordinates of at least three points, the distances to those three points from a known reference (i.e., the moving platform), and knowing the exact movement required by the moving platform to move the three points from being in the view of the camera to the focal point of the height gauge, a controller can be operated to calculate the position and orientation of the second object held by the chuck assembly.

4. Determining the position and orientation of the first object. This can be accomplished by obtaining an image of the surface of the first object, including at least three points on the surface of the first object, using a camera mounted on the chuck assembly. To obtain this image, the linear actuators can be operated to move the moving platform such that the object held by the moving platform is proximate the camera. Further, the linear actuators can be operated to move the first object proximate to a height gauge mounted on the chuck assembly to determine the distance to each of the three or more points identified on the surface of the first object. Again, knowing the X and Y coordinates of the at least three points, and the distance to each of those at least three points, combined with the movement required to move those three points from in front of the camera to in front of the height gauge, a controller can be utilized to determine the orientation of the first object.

5. Operating the linear actuators until the first object and the second object are aligned with six degrees of freedom and placed in contact.

For performing a test method, the objects can comprise a semiconductor component, and an interconnect for making temporary electrical connections to the component. In this case, step 5 places contacts on the component in electrical communication with contacts on the substrate. Test signals can then be applied through the interconnect to the component, to test the operability of integrated circuits on the component.

Thus, the invention provides an apparatus and method for aligning and connecting two objects. While the invention has been described with reference to certain preferred embodiments, as those skilled in the art will appreciate, certain changes and modifications can be made without departing from the scope of the present invention as defined by the following claims.

What is claimed is:

1. An apparatus for aligning and connecting a semiconductor component to a substrate comprising:

a platform assembly for holding the component comprising a fixed platform and a moving platform connected to the fixed platform by a plurality of linear actuators configured to move the moving platform in three translational directions and in three rotational directions;

a chuck assembly proximate to the platform assembly for holding the substrate;

a first camera and a first height gauge proximate to the chuck assembly for determining a first position and a first orientation of a plurality of first contacts on the component;

a second camera and second height gauge proximate to the platform assembly for determining a second position and a second orientation of a plurality of second contacts on the substrate; and a controller in signal communication with the linear actuators, in signal communication with the first camera and the second camera, and in signal communication with the first height gauge and the second height gauge, the controller configured to operate the linear actuators to align and connect the first contacts and the second contacts.

2. The apparatus of claim 1 wherein the component comprises an element selected from the group consisting of semiconductor dice, semiconductor packages, semiconductor wafers, interconnects, and field emission display components.

3. The apparatus of claim 2 wherein the substrate comprises an element selected from the group consisting of interconnects, probe cards, circuit boards, leadframes, multi chip module substrates, and field emission display components.

4. An apparatus for aligning and connecting a semiconductor component to a substrate comprising:

a platform assembly for holding the substrate comprising a fixed platform, and a moving platform connected to the fixed platform by a plurality of linear actuators configured to move the moving platform in three translational directions and in three rotational directions;

a chuck assembly proximate to the platform assembly for holding the component;

at least one camera proximate to the platform assembly or the chuck assembly configured to obtain images of the component and the substrate;

at least one distance measuring device proximate to the platform assembly or the chuck assembly configured to obtain distances between the component and the substrate; and a controller in signal communication with the camera, the distance measuring device and the linear actuators, the controller configured to control movement of the moving platform responsive to signals from the camera and the distance measuring device.

5. The apparatus of claim 4 wherein the platform assembly comprises a hexapod.

6. The apparatus of claim 4 wherein the controller comprises a computer or a CPU.

7. The apparatus of claim 4 further comprising a holding mechanism on the moving platform for holding the substrate in a fixed relationship to the component on the moving platform.

8. The apparatus of claim 4 wherein the component comprises a semiconductor die and the substrate comprises an interconnect.

9. The apparatus of claim 4 wherein the controller is configured to operate each of the linear actuators independently.

10. The apparatus of claim 4 wherein the substrate comprises a lead frame and the component comprises a semiconductor die.

11. The apparatus of claim 4 wherein the substrate comprises a probe card and the component comprises a semiconductor wafer.

12. The apparatus of claim 4 wherein the substrate comprises a semiconductor wafer and the component comprises a probe card.

13. The apparatus of claim 4 wherein the substrate comprises a baseplate and the component comprises a semiconductor die.

14. An apparatus for probe testing a semiconductor wafer comprising:

a probe card comprising a plurality of first contacts for electrically engaging a plurality of second contacts on the wafer;

a platform assembly for holding the probe card including a fixed platform and a moving platform connected to the fixed platform by a plurality of linear actuators configured to move the moving platform in three translational directions and in three rotational directions;

at least one camera proximate to the platform assembly or the chuck assembly configured to obtain images of contacts on the wafer and on the probe card;

at least one distance measuring device proximate to the platform assembly or the chuck assembly configured to obtain distances between the contacts; and a controller in signal communication with the camera, the distance measuring device and the linear actuators, the controller configured to control movement of the moving platform responsive to signals from the camera and the distance measuring device to place the contacts on the wafer and on the probe card in physical and electrical contact.

15. An apparatus for testing a semiconductor component comprising:

a substrate comprising a plurality of first contacts for electrically engaging a plurality of second contacts on the component;

a hexapod comprising a platform for holding the substrate configured to move in three translational directions and in three degrees rotational directions;

a chuck proximate to the platform for holding the component;

at least one camera proximate to the hexapod configured to determine a position and an orientation of the first contacts and the second contacts; and a controller in signal communication with the camera configured to operate the platform to align and place the first contacts and the second contacts in physical and electrical contact.

16. The apparatus of claim 15 wherein the platform comprises a plurality of linear actuators operable by the controller responsive to signals from the camera.

17. The apparatus of claim 15 wherein the component comprises a semiconductor wafer and the substrate comprises a probe card.

18. The apparatus of claim 15 wherein the component comprises a semiconductor die and the substrate comprises an interconnect.

19. The apparatus of claim 15 wherein the component comprises a semiconductor package and the substrate comprises an interconnect.

20. The apparatus of claim 15 wherein the second contacts comprise bumps and the first contacts are configured to retain the bumps.

21. An apparatus for attaching a semiconductor component to a substrate comprising:
- a hexapod comprising a platform for holding the component configured to move in three translational directions and in three rotational directions;
- a chuck proximate to the platform for holding the substrate;
- at least one camera proximate to the hexapod configured to determine a position and an orientation of a plurality of first contacts on the component and a plurality of second contacts on the substrate; and
- a controller in signal communication with the optical device configured to operate the platform to align and place the first contacts and the second contacts in physical and electrical contact.

22. The apparatus of claim 21 wherein the component comprises a semiconductor die or package and the substrate comprises a board.

23. The apparatus of claim 21 wherein the component comprises a semiconductor die and the substrate comprises a lead frame.

24. The apparatus of claim 21 wherein the component comprises a semiconductor package and the substrate comprises a board.

25. The apparatus of claim 21 wherein the platform comprises a plurality of linear actuators operable by the controller responsive to the optical device.

26. An apparatus for wire bonding a semiconductor component to a substrate comprising:
- a wire bonding tool;
- a platform for holding the bonding tool configured to move the bonding tool in three translational directions and in three degrees rotational directions;
- a chuck proximate to the platform for holding the component and the substrate;
- at least one camera proximate to the hexapod configured to determine a position and an orientation of the bonding tool and of contacts on the component and the substrate; and
- a controller in signal communication with the camera configured to operate the platform to move the bonding tool for wire bonding wires to the contacts.

27. The apparatus of claim 26 wherein the platform comprises a hexapod.

28. The apparatus of claim 26 wherein the platform comprises a plurality of linear acutators operable by the controller to move the bonding tool.

* * * * *